United States Patent

Jeong et al.

[11] Patent Number: 6,094,103
[45] Date of Patent: Jul. 25, 2000

[54] MULTIPLE FEEDBACK LOOP RING OSCILLATOR AND DELAY CELL

[75] Inventors: Dong Youl Jeong, Uiwang; Gyu Hyung Cho, Daejeon; Sang Hoon Chai, Daejeon; Won Chul Song, Daejeon; Kyung Soo Kim, Daejeon, all of Rep. of Korea

[73] Assignees: Electronics and Telecommunications Research Institute, Daejeon; Korea Telecom, Seoul, both of Rep. of Korea

[21] Appl. No.: 09/099,566

[22] Filed: Jun. 18, 1998

[30] Foreign Application Priority Data

Sep. 18, 1997 [KR] Rep. of Korea .................. 97-47572

[51] Int. Cl.[7] .................................................. H03B 27/00
[52] U.S. Cl. ........................................ 331/57; 331/177 R
[58] Field of Search ................................. 331/57, 177 R

[56] References Cited

U.S. PATENT DOCUMENTS

| 5,355,097 | 10/1994 | Scott et al. | 331/1 A |
|---|---|---|---|
| 5,426,384 | 6/1995 | May | 327/52 |
| 5,457,429 | 10/1995 | Ogawa et al. | 331/57 |
| 5,548,251 | 8/1996 | Chou et al. | 331/57 |
| 5,841,325 | 11/1998 | Knotts et al. | 331/57 |

OTHER PUBLICATIONS

Aaron W. Buchwald, Kenneth W. Martin, Aaron K. Oki, and Kevin W. Kobayashi, A 6–GHz Integrated Phase–Locked Loop Using A1GaAs/GaAs Heterojunction Bipolar transistors, Dec., 1992, pp. 1752–1761.

*Primary Examiner*—Robert Pascal
*Assistant Examiner*—Henry Choe
*Attorney, Agent, or Firm*—Cohen, Pontani, Lieberman & Pavane

[57] ABSTRACT

Disclosed is a multiple feedback loop ring oscillator and delay cell with high oscillation voltage. It is an object of the present invention to implement a new ring oscillator for the VCO of a high speed PLL and a proper delay cell with a high speed and low noise. The apparatus is composed of multiple feedback loop ring oscillator that 4 delay cells which have the first main input stage, the second main input stage, the first subsidiary input stage, the second subsidiary input stage, the third subsidiary input stage, the forth subsidiary input stage, the first output stage and the second output stage is connected to the main loop and subsidiary loop. The present invention has advantages that it can be operated in high speed, it has a low power sensitivity, there is no power noise because there is no variation of a supply current and it can improve noise characteristics.

4 Claims, 9 Drawing Sheets

MULTIPLE FEEDBACK LOOP RING OSCILLATOR AND DELAY CELL

BACKGROUND OF THE INVENTION

1. Field of the Invention

The present invention relates to a multiple feedback loop ring oscillator with a high oscillation frequency and its delay cells.

2. Description of the Prior Art

In an optical communication using Asynchronous Transfer Mode (abbreviated as "ATM"), a transmitter sends serial data without timing information, i.e., clocks, and a receiver restores clocks from the received serial data, thereby obtains data synchronized the restored clocks. It is called a clock recovery circuit, the Phase-Locked Loop (abbreviated as "PLL") often used for this purpose. A high speed clock recovery circuit is needed and an oscillator has to be operated in high speed because high speed communication is more and more needed for a transmission and reception of more data in a proposed time.

PLL is widely used in the clock recovery circuit, a frequency synthesizer, a clock generator and a clock synchronization apparatus for a microprocessor. A controlled oscillator is a main part of a PLL, and it is classified into a voltage-controlled oscillator (abbreviated as "VCO") and a current-controlled oscillator (abbreviated as "CCO") in accordance-with oscillation frequency control methods. For a voltage-controlled oscillator an oscillation frequency is controlled by voltage and for a current-controlled oscillator it is controlled by current.

Both a voltage-controlled oscillator and a current-controlled oscillator have only one difference that voltage control an oscillation frequency or current from a voltage-to-current converter do it, so we'll call them VCO shortly from now onwards.

VCO implemented by integrated circuits is a ring oscillator, a relaxation oscillator and an LC oscillator. Important characteristic variables of VCO are jitter which are measured output vibration on a time domain, removal characteristics of power and substrate noise, and tuning ranges which present variable ranges of oscillation frequency followed by controlled voltage. The ring oscillator and the relaxation oscillator have an advantage that they can be implemented easily and have a wide tuning range. On the contrary, they have bad noise characteristics. In the LC oscillator, it shows good noise characteristics but it has narrow tuning ranges.

To obtain a high oscillation frequency in the ring oscillator, we can consider three points of view such as. Processes, delay cells and a structure of the ring oscillator. In a view point of processes, devices which have to operate in a high speed such as an oscillator or a mixer in a PLL in a waveband over a Gigahertz waveband can be manufactured by high speed processes like GaAs or bipolar. But such processes are expensive and have a low density, so it is more preferable to use Complementary Metal Oxide Semiconductor (abbreviated as "CMOS") processes for a high density and low cost. In CMOS processes, an operating speed of transistors is low compared to other processes, so when using CMOS process new design techniques are needed to obtain a high speed.

The oscillation frequency of oscillator depends upon the magnitude of output swing. Oscillation frequency becomes low in case of large output swing because more time that charge and discharge a load capacitance is needed comparing with small output swing. So in a view point of delay cells to obtain a high oscillation frequency, we have to constrain properly the output swing. For a same current because the more output impedance increases, the more output swing increases, we can decrease a load resistor of a delay cell to decrease output swing.

Transistors operated in triode region have much smaller output resistance value than those operated in saturation region do, thus the delay cell using transistors operated in triode region as its load can operate in a high speed because of a small output swing.

In the method using triode transistor as a load, the load is always on a triode region in the all-oscillation region of a ring oscillator, so an oscillation frequency is proportioned to a control voltage or current, and Replica Biasing methods which control indirectly ring oscillator's output using delay cells similar with a ring oscillator is used. This method can correctly control output swing, although it has a disadvantage that the power noise characteristic is bad because an output is connected to a power line directly through a small impedance triode transistor.

The other method to reduce output swing is a clamping of output voltage by using diodes. If we connect a gate and a drain of transistor, we can use it as a diode because the transistor is in a saturation region. If a diode turns on, the voltage of both terminals of a diode is proportional to the square root of a current, and a voltage dropping of diode is small, so it can be used as a voltage clamping which fixes an output voltage to a specific voltage.

As described above, in the conventional method which reduces output swing through a clamping of output voltage by using a diode, the output is directly connected to a power or a ground line through a transistor operated as a diode. Also in this case, because of the diode with a small impedance it has a disadvantage that the power sensitivity is high and the power noise characteristic is bad.

The ring oscillator is comprised of a negative feedback loop in a DC state. It oscillates if a loop gain is larger than '1' in the frequency that the total phase delay of a ring loop becomes 360 degrees. It is needed odd numbered stages to compose a negative feedback loop in the single-ended ring oscillator, however in the differential structured ring oscillator a negative feedback loop can be composed of even numbered stages.

The oscillation frequency, 1/(2NTd), is given inversely proportional to the delay time of a unit delay cell and the number of stages composed ring when the delay of the unit delay cell is Td and the number of stages is N. Therefore in a view point of the structure of the ring oscillator, the simplest method that increases the oscillation frequency is to reduce the number of stages of ring oscillator. However the fewer stages of ring oscillator are reduced, the more a minimum gain and a phase delay requested at a delay cell of each stage are increased for an oscillation. For example, in 4 stages ring oscillator the minimum gain and phase delay of each stage for an oscillation are each square root 2 and 90 degrees, but in 3 stages ring oscillator they are each 2 and 120 degrees.

The fewer the number of stages of ring oscillator is reduced, the more difficult phase delay conditions are satisfied among oscillation conditions such as a minimum gain, a phase delay, and so on. The phase delay has to be 180 degrees in case of 2 stages ring oscillator, and 360 degrees in case of 1 stage ring oscillator at each stage. One-stage amplifier is used as the delay cell of ring oscillator for the high oscillation frequency. However the delay cell with only simple one-stage amplifier is of no use in case of the ring oscillator less than 2 stages, because the maximum phase delay of one-stage amplifier is 180 degrees in an infinite frequency.

Therefore, in case of the ring oscillator less than 2 stages, we have to add phase delay factors such as capacitors or increase the phase delay of a delay cell using a positive feedback. In case of CMOS circuits, the oscillation frequency of the ring oscillator less than 2 stages becomes lower and more unstable than that of 3 stages ring oscillator because of the loading effect of added circuits for the purpose of the above method, so in CMOS processes we make a ring oscillator with more than 3 stages.

Data are transmitted in the serial form without clock signals in serial data communications. The receiver restores clock signals from pulse signals received continuously per given times of a unit bit period, and it revives data by synchronizing to the restored clocks. Jitter, the state that restored clocks vibrate continuously, has to be minimized in order that error rates of revived data are satisfied with given specifications.

In the conventional methods, the passive resonator which is tuned to known date rates is used to restore clocks, more particularly, surface acoustic wave (abbreviated as "SAW") filter is often used in the data rates more than 1 Gb/s. As described above, the method that restore clocks using the passive resonator with high Q has an advantage that jitter of restored clocks is small, however it has a disadvantage that a power consumption is high in order that it operates the resonator outside of a chip that has low impedance, and the delay time outside of a chip must be operated manually in order that it strobes optimum clocks in a data reviver.

However the method using PLL can solve above problems. In PLL all signals are operated inside of a chip, outside factors such as inductor or varactor in order to tuning VCO are not needed. Also because clocks can be restored from data existed on the whole frequency region of VCO, the drift of clocks caused by the variation of a temperature and a power line can be assimilated, and because a clock phase is fixed to an exact base signal such as crystal oscillator, it strobes optimally in a data reviving period.

High speed VCO is needed in order that high speed PLL is implemented.

In case of VCO which has no tuning elements with high Q outside the chip, it has many phase noises and jitter is caused in a restored clock, because of the external noise source such as a power noise and the noise of active elements such as a flicker noise of field effect transistor (abbreviated as "FET"), therefore, it is needed the method which can reduce noises. High speed VCO is needed in order that high speed PLL is implemented. As described above, there are such methods to implement high speed VCO; One is the method that uses high speed processes, another is the method that constrains output swing using replica biasing or diode clamping, the other is the method that reduces stages of a ring oscillator.

In a view point of a structure of a ring oscillator, to obtain high oscillation frequency of a ring oscillator, except the method which simply reduces stages of a ring oscillator, two conventional methods which restructure a ring oscillator for the purpose of high oscillation frequency as follows. one is the Pseudo One-Stage Ring Oscillator whose oscillation frequency is same as that of a 1 stage ring oscillator in a 3 stage ring oscillator, the other is the Frequency Quadrupling Ring Oscillator which can obtain 4 times oscillation frequency, more specifically, there is 90 degrees difference between In-phase and Quadrature-phase and In-phase signal multiplied by Quadrature-phase signal through mixer produecs 2 signals in mutual quadrature state, so the 2 signals in mutual quadrature state produce 4 times oscillation frequency by multiplying each other.

Figure 1A:
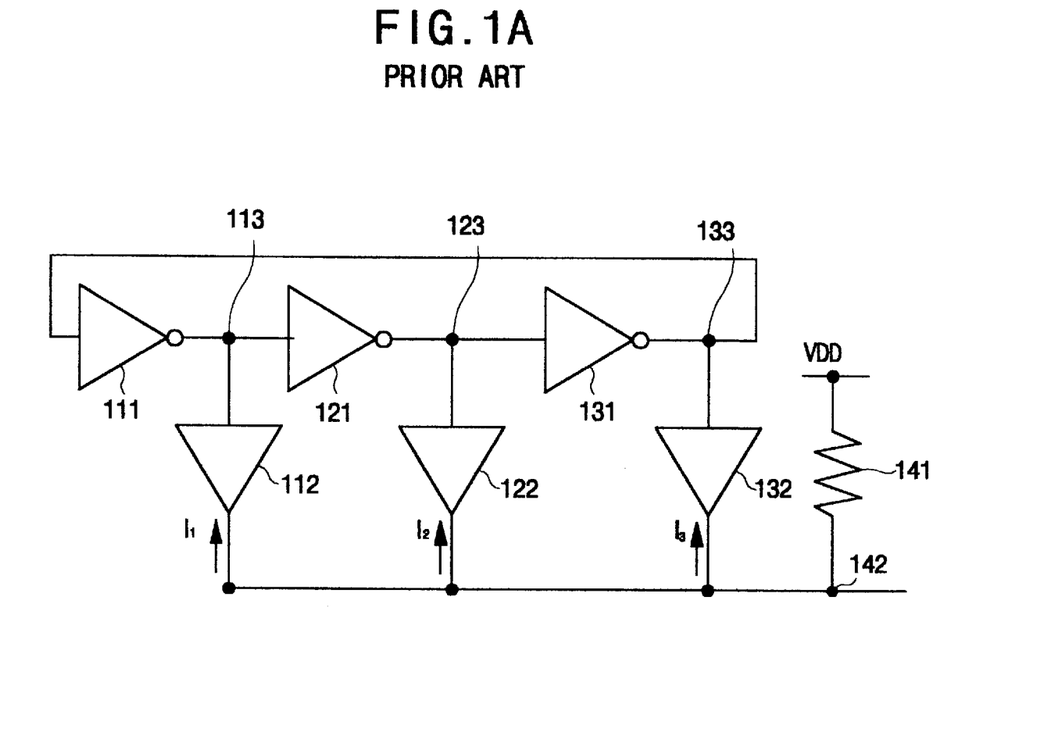
FIG. 1A is a circuit diagram of a conventional 1 stage ring oscillator.
Figure 1B:
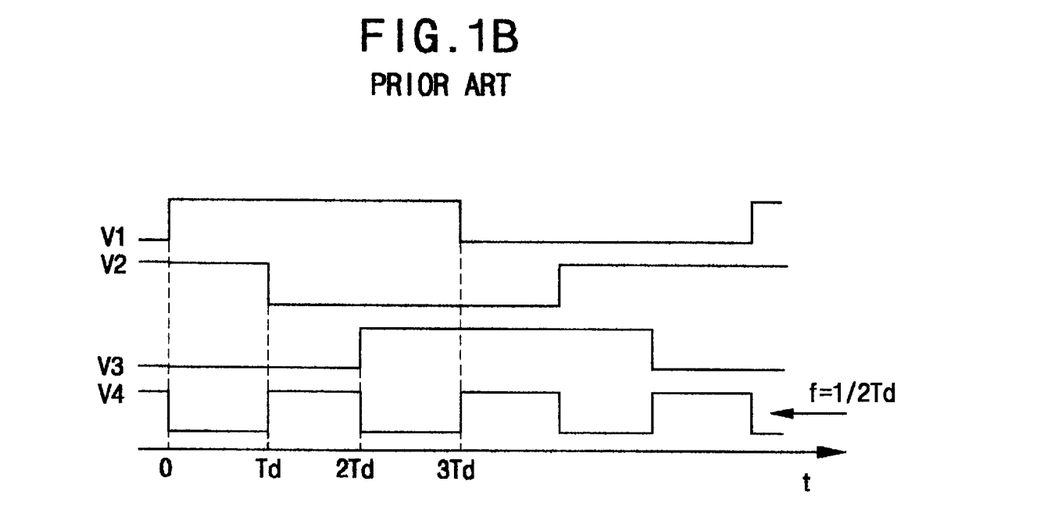
FIG. 1B is a output waveform of a conventional 1 stage ring oscillator.

FIG. 1A is a circuit diagram of a conventional 1 stage ring oscillator and FIG. 1B is a output waveform of a conventional 1 stage ring oscillator.

The conventional circuit and waveform of pseudo 1 stage ring oscillator will be described below in detail with reference to FIGS. 1A and 1B.

The conventional circuit of pseudo 1 stage ring oscillator comprises inverter delay cells (111, 121, 131) which construct 3 stages ring oscillator, 3 trans-conductance amplifiers (112, 122, 132) which transfer a voltage input to a current output and a load resistor (141). Output currents of 3 trans-conductance amplifiers (112, 122, 132) are each I1, I2 and I3. We will call the output current which flows in the direction of the arrow in FIG. 1A "Sinking", when the input of trans-conductance amplifier is increasing. Also we will call the output current which flows in the opposite direction of the arrow in FIG. 1A "Sourcing", when the input of transconductance amplifier is decreasing.

Now, it is shown an operating mechanism of the circuit. We will simply call trans-conductance amplifiers in FIG. 1A amplifiers. Voltages at output nodes (113, 123, 133, 142) are V1, V2, V3 and V4. Because the circuit is a 3 stages ring oscillator, waveforms of output voltages at each nodes of oscillator, V1, V2 and V3 are shown in FIG. 1B. Because amplifiers (112, 122) are in a high state when the output voltage of node (113), V1 is increasing, output currents of amplifiers (112, 122), I1 and I2 are "Sinking", the output current of an amplifier (132), I3 is "Sourcing" and the voltage of the node (142), V4 becomes low. When the output V2 of oscillator becomes low after Td unit delay time of oscillator, V4 becomes high because the output current of amplifier (122), I2 is changed from "Sinking" to "Sourcing".

When the output voltage V3 becomes high after another period, V4 becomes low because of the same reason. As the above operation, after one period in the ring oscillator, the output voltage V4 is same as shown in FIG. 1B, then the frequency of V4 is 1/2Td, which is same as the oscillation frequency of 1 stage ring oscillator. It is assumed output voltages shown in FIG. 1B to be ideal digital outputs, however real output voltages V1, V2 and V3 of high speed ring oscillator are nearly sinusoidal waves, have same amplitude and have phase difference of 120 degrees each other. Therefore, output currents of amplifier, I1, I2 and I3 are almost sinusoidal waves, have same amplitude and have phase difference of 120 degrees each other. The sum of three complete sinusoidal signals which have phase difference of 120 degrees each other is '0'. Hence the output voltage V4 has no change only DC value, because output currents I1, I2 and I3 are complete sinusoidal waves and the sum of this three currents at load resistor (141) is '0' if waves of each output nodes (113, 123, 133) shown in FIG. 1A are complete sinusoidal waves.

However, real delay cells and amplifiers are nonlinear, so harmonics factors exist in outputs. If delay cells and amplifiers are implemented as differential structures, in the output V4, the sum of harmonic factors of an even order is '0', and harmonic factors of an odd order remain. The 3rd order harmonic factor is largest among harmonic factors of an odd order, so the frequency of the output V4 becomes the oscillation frequency of the ring oscillator, namely 3 times frequency of a fundamental one and V4 is same as the oscillation frequency of 1 stage ring oscillator shown in FIG. 1B. The signal amplitude of harmonic factors is so small comparing with that of fundamental factors, because outputs of the ring oscillator operated in a high speed are nearly sinusoidal waves.

Eventually, the signal amplitude of outputs Vx is as small as tens or less mV. In PLL the oscillator's output operates other circuits such as mixer, but it is impossible that this signal operates well other circuits in a high frequency region. However in bipolar circuits, it is operated stably with tens of mV signals, so pseudo 1 stage ring oscillator shown in FIG. 1B is suitable not for CMOS only for bipolar circuits. In a real implementation to bipolar circuits, it is also used the method that the common base amplifier is added to the pre-stage of the load resistor (141) in order that it has harmonic factors increased.

Figure 2:
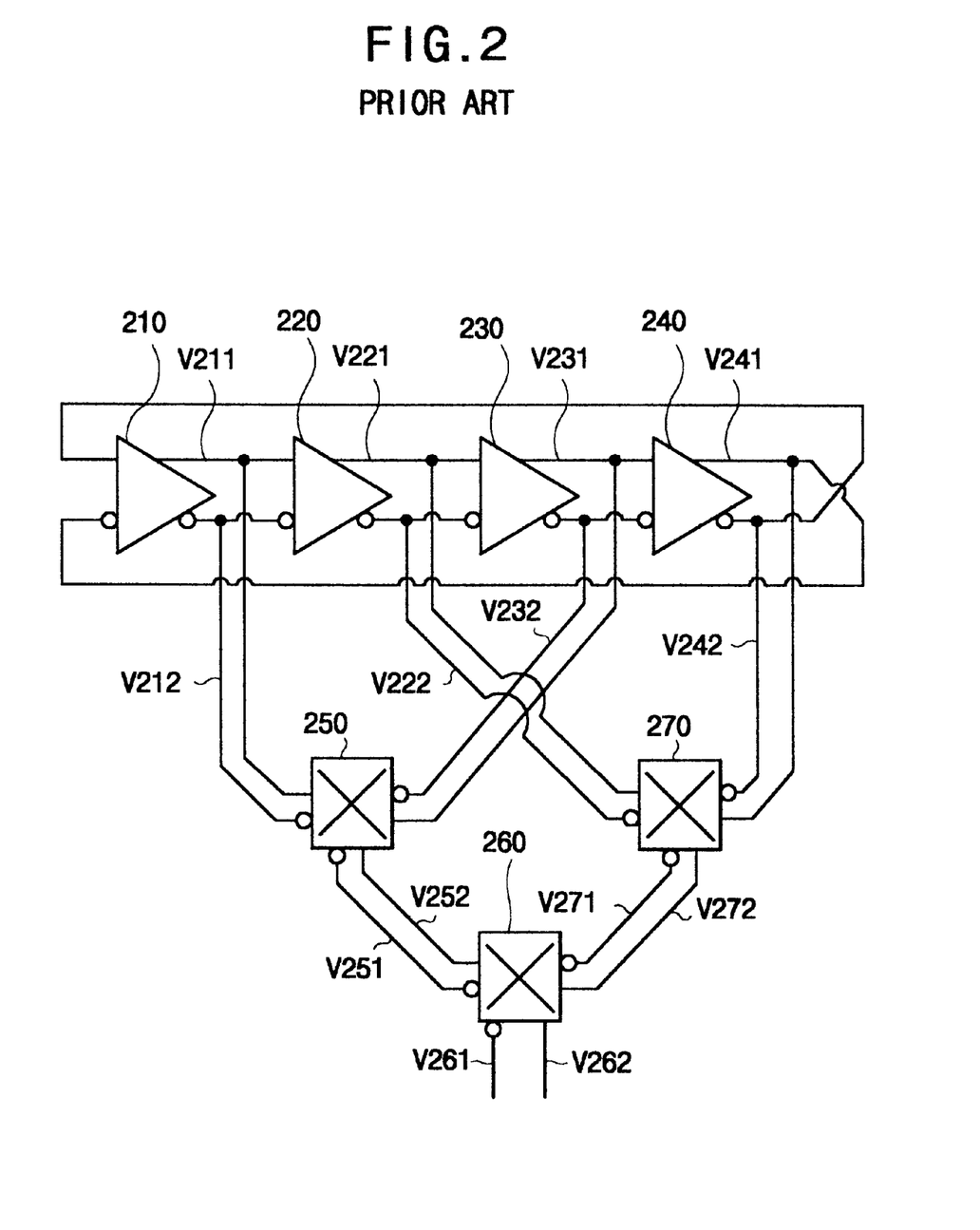
FIG. 2 is a circuit diagram of a conventional frequency-quadrupling ring oscillator.

FIG. 2 is a circuit diagram of a conventional frequency-quadrupling ring oscillator.

The circuit is composed of differential delay cells (210, 220, 230, 240) and differential mixers (250, 260, 270). If a ring oscillator has even numbers of stages, quadrature signals which have 90 degrees of phase difference exist among output signals.

For example, outputs V211 and V231, V221 and V241 are quadrature signals each other, and differential signals "V211–V212" and "V231–V232", "V221–V222" and "V241–V242" are also quadrature ones each other. Mixers (250, 260, 270) receive two differential signals of quadrature as inputs. Because mixer operates like a real analog multiplier, when two signals which are quadrature are multiplied each other, the frequency of a mixer is two times of input signal's frequency, so output voltages V252 and V271 of mixers (250, 270) are two times of ring oscillation frequency and quadrature each other at the same time.

Hence, outputs V261 and V262 of the mixer (260) which receive above two signals as inputs are four times of a ring oscillation frequency. The mixer circuit is implemented as in the form of Gilbert multiplier. In this case, mixers (250, 270) must operate in speed of 2 times of a ring frequency, the mixer (260) must operate in speed of 4 times.

Thus, it is impossible that the mixer circuit which operate in a high speed is implemented with CMOS. After all, the frequency-quadrupling ring oscillator is also not suitable for CMOS circuits.

Until now, we did examine methods that the high speed PLL is implemented in detail in many points of view. As described above, conventional structures of the ring oscillator which makes a oscillation frequency heightened are not suitable that implemented as CMOS circuits, so the new design of structure is required and the proper delay cell must be improved.

SUMMARY OF THE INVENTION

Therefore, it is an object of the present invention to provide the new structure of a ring oscillator for a high speed VCO of PLL and the suitable delay cell with high speed and low power.

To accomplish the object, it is provided that a first, a second and a third delay cells having each a first main input stage, a second main input stage, a first subsidiary input stage, a second subsidiary input stage, a first output stage and the a second output stage; a main loop in which the first output stage and the second output stage of said first delay cell are each connected to the second main input stage and the first main input stage of said second delay cell, the first output stage and the second output stage of said second delay cell are each connected to the second main input stage and the first main input stage of said third delay cell, and the first output stage and the second output stage of said third delay cell are each connected to the second main input stage and the first main input stage of said first delay cell; and a subsidiary loop in which the first subsidiary input stage and the second subsidiary input stage of said first delay cell are each connected to the first output stage and the second output stage of said second delay cell, the first subsidiary input stage and the second subsidiary input stage of said second delay cell are each connected to the first output stage and the second output stage of said third delay cell, and the first subsidiary input stage and the second subsidiary input stage of said third delay cell are each connected to the first output stage and the second output stage of said first delay cell.

To accomplish the object, it is also provided that a first, a second, a third and a forth delay cells having each a first main input stage, a second main input stage, a first subsidiary input stage, a second subsidiary input stage, a first output stage and a second output stage;
a main loop in which the first output stage and the second output stage of said first delay cell are each connected to the second main input stage and the first main input stage of said second delay cell, the first output stage and the second output stage of said second delay cell are each connected to the second main input stage and the first main input stage of said third delay cell, the first output stage and the second output stage of said third delay cell are each connected to the second main input stage and the first main input stage of said forth delay cell, and the first output stage and the second output stage of said forth delay cell are each connected to the first main input stage and the second main input stage of said first delay cell; and a subsidiary loop in which the first subsidiary input stage and the second subsidiary input stage of said first delay cell are each connected to the first output stage and the second output stage of said second delay cell, the first subsidiary input stage and the second subsidiary input stage of said second delay cell are each connected to the first output stage and the second output stage of said third delay cell, the first subsidiary input stage and the second subsidiary input stage of said third delay cell are each connected to the first output stage and the second output stage of the forth delay cell, and the first subsidiary input stage and the second subsidiary input stage of said forth delay cell are each connected to the first output stage and the second output stage of said first delay cell.

To accomplish the object, it is also provided that a first, a second, a third and a forth delay cells having each a first main input stage, a second main input stage, a first subsidiary input stage, a second subsidiary input stage, a first output stage and a second output stage; a main loop in which the first output stage and the second output stage of said first delay cell are each connected to the second main input stage and the first main input stage of said second To delay cell, the first output stage and the second output stage of said second delay cell are each connected to the second main input stage and the first main input stage of said third delay cell, the first output stage and the second output stage of said third delay cell are each connected to the second main input stage and the first main input stage of said forth delay cell, and the first output stage and the second output stage of said forth delay cell are each connected to the first main input stage and the second main input stage of said first delay cell; a subsidiary loop in which the first subsidiary input stage and the second subsidiary input stage of said first delay cell are each connected to the second output stage and the first output stage of said third delay cell, the first subsidiary input stage and the second subsidiary input stage of said second delay cell are each connected to the first output stage and the second output stage of said forth delay cell, the first subsidiary input stage and the second subsidiary input stage of said third delay cell are each connected to the first output stage and the second output stage of said first delay cell, and the first subsidiary input stage and the second subsidiary input stage of said forth delay cell are each connected to the first output stage and the second output stage of said second delay cell.

To accomplish the object, it is also provided that a first, a second, a third and a forth delay cells having each a first main input stage, a second main input stage, a first subsidiary input stage, a second subsidiary input stage, a third subsidiary input stage, a forth subsidiary input stage, a first output stage and a second output stage; a main loop in which the first output stage and the second output stage of said first delay cell are each connected to the second main input stage and the first main input stage of said second delay cell, the first output stage and the second output stage of said second delay cell are each connected to the second main input stage and the first main input stage of said third delay cell, the first output stage and the second output stage of said third delay cell are each connected to the second main input stage and the first main input stage of said forth delay cell, and the first output stage and the second output stage of said forth delay cell are each connected to the first main input stage and the second main input stage of said first delay cell; a first subsidiary loop in which the first subsidiary input stage and the second subsidiary input stage of said first delay cell are each connected to the second output stage and the first output stage of said third delay cell, the first subsidiary input stage and the second subsidiary input stage of said second delay cell are each connected to the second output stage and the first output stage of said forth delay cell, the first subsidiary input stage and the second subsidiary input stage of said third delay cell are each connected to the second output stage and the first output stage of said first delay cell, and the first subsidiary input stage and the second subsidiary input stage of said forth delay cell are each connected to the second output stage and the firth output stage of said second delay cell; a second subsidiary loop in which the third subsidiary input stage and the forth subsidiary input stage of said first delay cell are each connected to the first output stage and the second output stage of said second delay cell, the third subsidiary input stage and the forth subsidiary input stage of said second delay cell are each connected to the first output stage and the second output stage of said third delay cell, the third subsidiary input stage and the forth subsidiary input stage of said third delay cell are each connected to the first output stage and the second output stage of said forth delay cell, and the third subsidiary input stage and the forth subsidiary input stage of said forth delay cell are each connected to the first output stage and the second output stage of said first delay cell.

To accomplish the object, it is also provided the delay cell for the multiple feedback loop ring oscillator comprising a means for outputting two delayed output signals and simultaneously biasing the delay cell; a means for receiving two main input signals in order to amplify them for the outputting and biasing means; and a means for receiving two subsidiary input signals in order to amplify them for the outputting and biasing means.

BRIEF DESCRIPTION OF THE DRAWINGS

These and other advantages of the present invention will be more apparent by describing a preferred embodiment of the present invention with reference to the attached drawings, in which.

DETAILED DESCRIPTION OF THE INVENTION

Now, the present invention will be described below in detail with reference to attached figures.

The delay cell proposed by the present invention uses the voltage clamping in order that it constrains the output swing then it makes the oscillation frequency increased. However, in a difference from conventional methods, the output is not connected to a power or a ground line through a diode directly, the power sensitivity is decreased because it is separated by a current source with a high impedance, and it can keep the current of a power up almost constantly when the delay cell circuit is operating because the load current flows through the voltage clamping circuit if a operated transistor turns off.

There are parasitic resistance and inductance in power lines and package leads inside of real integrated circuits, hence the fluctuation of current in this parasitic elements causes the fluctuation of voltage of a power. In a view point of a circuit, this fluctuation of voltage of a power is a power noise and noise characteristics of the circuit get worse.

However, the delay cell proposed by the present invention has good power noise characteristics, because there are few variations of power current, therefore, power noise is not caused by the operation of the circuit itself.

Figure 3A:
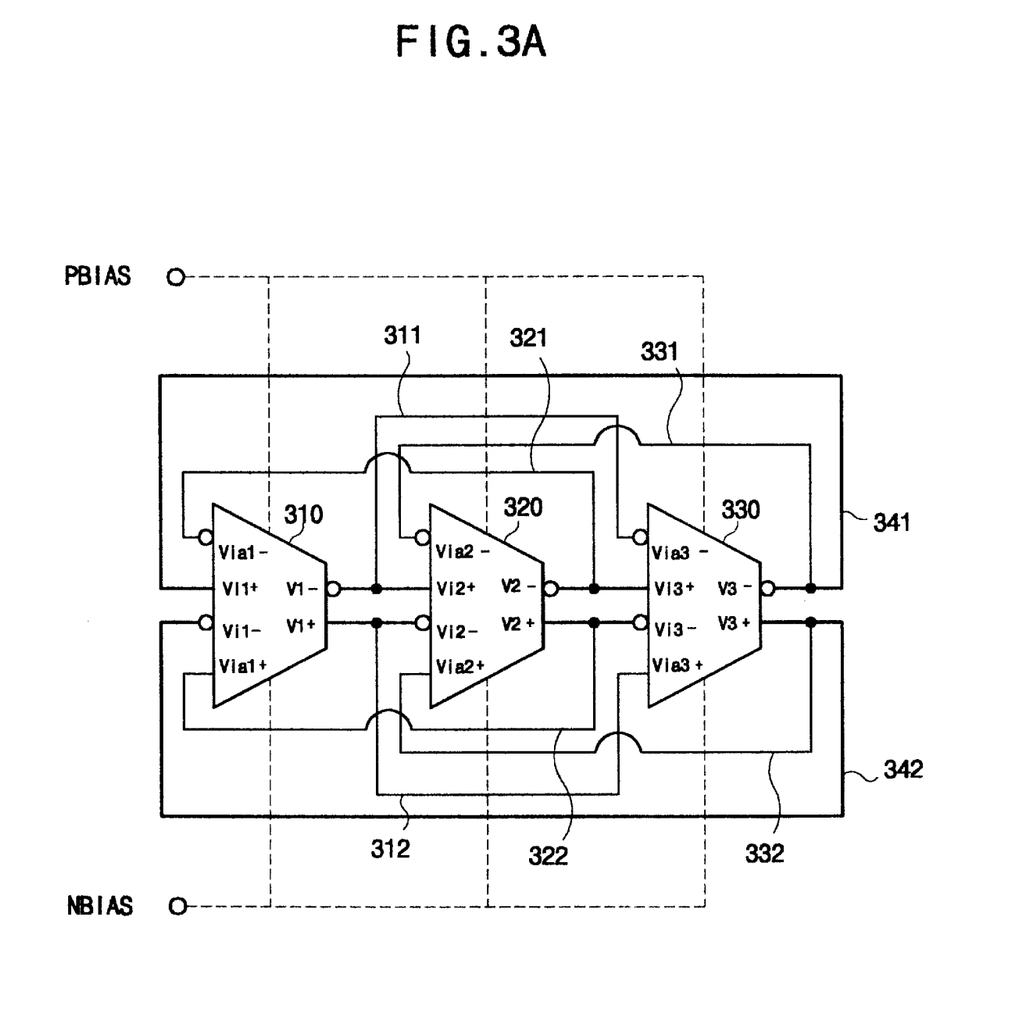
FIG. 3A is a circuit diagram of a 3 stages—2 substages multiple feedback loop ring oscillator according to the present invention.

FIG. 3A is a circuit diagram of a 3 stages—2 substages multiple feedback loop ring oscillator according to the present invention. The oscillator comprises three differential delay cells (310, 320, 330). Numbers 311, 312, 321, 322, 331, 332, 341 and 342 represent a main or subsidiary ring loop. For the purpose of clear representations of a main or subsidiary ring loop, for example, we will represent each loop as the loop (312), and we will use same representations for ring loops of a ring oscillator from now on.

In FIG. 3A, plus and minus outputs of the delay cell (310) will be represented by V1+ and V1−, plus and minus outputs of the delay cell (320) will be represented by V2+ and V2−, plus and minus outputs of the delay cell (330) will be represented by V3+ and V3−, respectively. If we regard this ring oscillator as a single-ended circuit, there are two 3-stage main ring loops, loop (341) and loop (342) from delay cell (310)–delay cell (320)–delay cell (330) and leading wire (341, 342).

Structures of 2-stage subsidiary ring loops comprise as follows.

The loop (311) and the loop (312) from delay cell (310)–delay cell (320) and leading wire (311, 312), the loop (321) and the loop (322) from delay cell (320)–delay cell (330) and leading wire (322, 321), and the loop (331) and the loop (332) from delay cell (330)–delay cell (310) and leading wire (331, 332), that is, total 6 2-stage subsidiary ring loops (311, 312, 321, 322, 331, 332).

In a view point of differential signals, above main and subsidiary loops comprise one 3-stage main ring loop and three 2-stage subsidiary ring loops. However, the conventional differential 3-stage ring oscillator has only one differential loop, on the contrary, ring oscillators proposed in the present invention are composed of several feedback loops, so we call them "Multiple feedback loop ring oscillators".

Differential delay cells (310, 320, 330) each comprise two differential input stages, which are plus and minus main inputs (Vi1+, Vi1−, Vi2+, Vi2−, Vi3+, Vi3−) for the purpose of the structure of the 3-stage main ring loop and plus and minus subsidiary inputs (Via1+, Via1−, Via2+, Via2−, Via3+, Via3−) for the purpose of the structure of the 2-stage subsidiary ring loop.

The plus output V3+ and the minus output V3− of the delay cell (330) are each connected to the minus main input Vi1− and plus main input Vi1+ of the delay cell (310), which are the loop (341) and the loop (342), so that they are the 3-stage main ring loops. The 2-stage subsidiary ring loops are composed of loops (311, 312, 321, 322, 331, 332) of two delay cells, namely, plus and minus outputs of the previous delay cell, V1+, V1−, V2+, V2−, V3+and V3− are each connected to plus and minus inputs of the next delay cell, Vi2+, Vi2−, Vi3+, Vi3−, Vi1+ and Vi1−, and plus and minus outputs of the next delay cell, V1+, V1−, V2+, V2−, V3+ and V3− are each connected to plus and minus subsidiary inputs of the previous delay cell, Via3+, Via3−, Via1+, Via1−, Via2+ and Via2−.

For example, outputs V1+ and V1− of the delay cell (310) are each connected to main inputs Vi2− and Vi2+ of the delay cell (320), and outputs V2+ and V2− of the delay cell (320) are each connected to subsidiary inputs Via1+ and Via1− through leading lines (322, 321), which are 2-stage loops composed of the delay cell (310) and the delay cell (320), so that they are 2-stage subsidiary ring loops, the loop (322) and the loop (321).

Figure 3B:
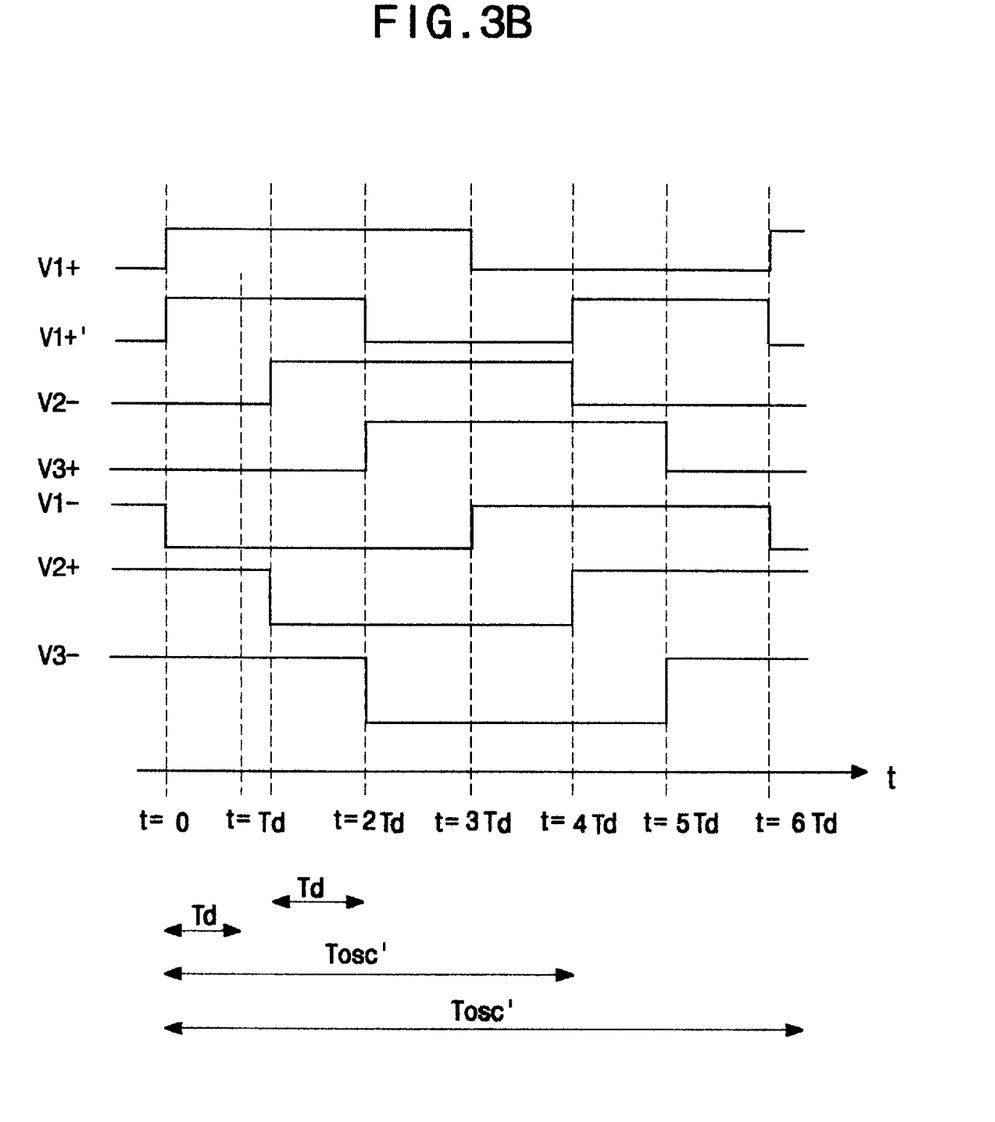
FIG. 3B is a output waveform of a 3 stages—2 substages multiple feedback loop ring oscillator according to the present invention.

FIG. 3B is a output waveform of a 3 stages—2 substages multiple feedback loop ring oscillator according to the present invention.

In FIG. 3B, we simply assume output waveforms to be square waves. Because loops of a ring oscillator must be negative feedback loops in a DC state, 3-stage main rings are completed when outputs of each stage delay cells are connected to main inputs of next stage delay cells. At this time, plus and minus outputs V1+, V1−, V2+, V2−, V3+ and V3− of each stage delay cells are connected to minus and plus main inputs Vi2+, Vi2−, Vi3+, Vi3−, Vi1+ and Vi1− of each next stage delay cells, so that there are negative feedback loops in a DC stage.

For example, if we assume the first phase of the plus output V1+ of the delay cell (310) to be plus, it becomes minus when the phase of the V1+ passes through the delay cell (320), the delay cell (330) and the delay cell (310) orderly, so that it is the negative feedback loop. When the phase delay of the loop gain of this oscillator becomes 360 degrees, the loop changes to the positive feedback and oscillates at the frequency at which the loop gain becomes larger than '1'. In an oscillation, the total (DC+AC) phase delay of the loop must be 360 degrees, so the total phase delay of each delay cell must be 120 degrees.

120 degrees phase delay means minus 240 degrees phase, and DC phase delay of 180 degrees, so each stage has AC phase delay of 60 degrees.

Therefore, output waveforms of each delay cell are in FIG. 3B. In FIG. 3B, waveforms of the actual oscillator are nearly sinusoidal waves, waveforms of rectangular waves are shown in order to explain more easily the principle that the valid delay time of multiple feedback loop ring oscillator proposed in this invention is decreased. Td, Tosc and V1~V3 in FIG. 3B each mean delay time of each stage, oscillation period of a ring oscillator and voltages at the output node in case that subsidiary ring loop doesn't exist, and Td', Tosc' and V1+' each mean delay time, oscillation period and plus output voltage of the delay cell (310) in case that subsidiary ring loop exists. Output waveforms of other nodes are abridged because they can be obtained easily.

At first, we will accentuate and explain the process obtaining plus output V1+ of the delay cell (310) in case that subsidiary ring loop doesn't exist. When t=0 initially, it is assumed that V1+ is high. Then V2+ becomes low after unit delay time Td of the delay cell, V3+ becomes high after next Td.

Therefore, V1+ becomes low and accomplishes half period operation of the oscillation period Tosc in t=3Td, also it is operated with same principle in another half period then oscillation period becomes 6Td. The oscillation frequency can be higher if V1+ in FIG. 3B transfers high or low more quickly.

But, 2Td is needed in order that the transition of V1+appears to that of V3+, and the transition of V1+ occurs again after Td, if we add the signal that has small phase delay, i.e, has faster transition than V3+ to the delay cell (310), so V1+ has faster transition, the oscillation frequency can be higher. In FIG. 3B, we can see V2− is more faster signal having 60 degrees as a difference than V3+.

Therefore, if V2− is connected to the plus subsidiary input Via1+ of the delay cell (310), the transition time of V1+ can be decreased. Because of the differential structure, V2+ which has 180 degrees phase difference from V2− must be connected to the minus subsidiary input Via2− of the delay cell (310). However, this structures are possible for only AC structures. As described above, in order to operate the ring oscillator stably, every ring loops must be negative feedback loops in DC. However, if we construct subsidiary ring loops as above methods, the ring oscillator doesn't oscillate because subsidiary ring loops are positive feedback loops in DC. But this problem can be solved easily because of differential structure. That is, if V2+ contrary to V2− is connected to the plus subsidiary input Via1+ of the delay cell (310) and V2− is connected to the minus subsidiary input Via1−, subsidiary 2 stage ring loops become negative feedback loops in DC, and the transition occurs faster than conventional ring oscillator in outputs of the delay cell (310)

when it oscillates, so the oscillation frequency of the ring oscillator can be increased. Subsidiary ring loops, loops (311, 331) can be formed as same methods for other two delay cells (320, 330).

In this case, 2 stage subsidiary ring loops are same as conventional methods constructing 2 stage ring oscillator. FIG. 3A is a circuit diagram of a 3 stages—2 substages multiple feedback loop ring oscillator according to the present invention. In waveforms of V1+', unit delay time of each delay cell decrease from Td to Td' as shown in FIG. 3B, so the oscillation frequency decrease to Tosc'. The transition of outputs of each delay cell occurs more quickly by subsidiary ring loops, which is same as the delay time decrease, so multiple feedback ring oscillator is a new structure of ring oscillators which reduces effective delay time of delay cells and increase oscillation frequency.

In a PLL such as a Quadri-correlator, quadrature signals having 90 degrees phase difference are needed. Quadrature signals can be obtained easily from ring oscillator having even numbers of stages. The oscillation frequency of the 4 stage ring oscillator is lower than that of the 3 stage ring oscillator, so in order to construct high speed PLL, we add multiple feedback loops to the 4 stage ring oscillator, so the oscillation frequency can be increased.

For the 4 stage ring oscillator if we add subsidiary ring loops, the multiple feedback loops ring oscillator can be formed, and as described above, the oscillation frequency can be increased. We can construct 3 types of multiple feedback loop ring oscillators for the 4 stage ring oscillator.

Figure 4:
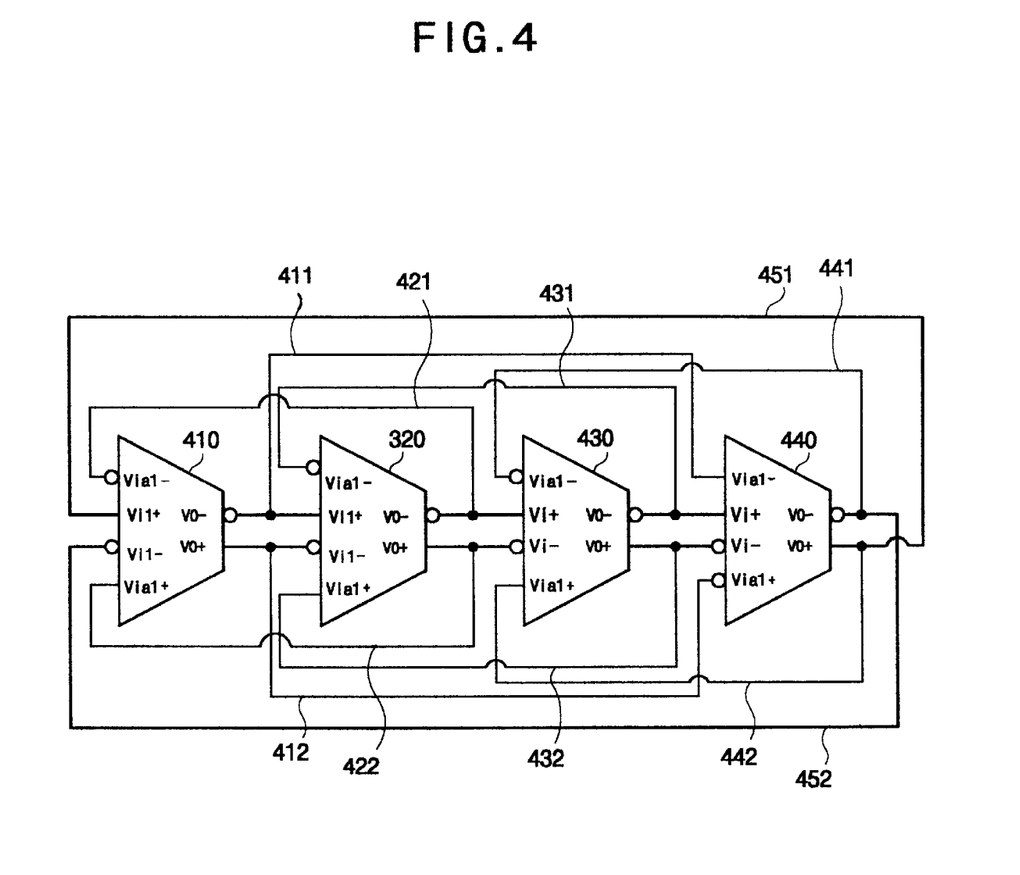
FIG. 4 is a circuit diagram of a 4 stages—2 substages multiple feedback loop ring oscillator according to the present invention.

FIG. 4 is a circuit diagram of a 4 stages—2 substages multiple feedback loop ring oscillator according to the present invention. This circuit comprises 4 differential delay cells (410, 420, 430, 440). In the circuit diagram, bias input stage is same as FIG. 3A and abbreviated because it is not required necessarily to explain multiple loop ring oscillator. Differential delay cells (410, 420, 430, 440) have two differential input stages same as in FIG. 3A, and they comprise plus and minus main inputs (Vi+, Vi−) for the 4 stage main ring loop, plus and minus subsidiary inputs (Via+, Via−) for the 2 stage subsidiary ring loop and plus and minus outputs (Vo+, Vo−).

The 4 stage main ring loop comprises the loop (452) and the loop (451), for negative feedback loops in DC, two outputs Vo+ and Vo− of the delay cell (440) are each connected to plus main input Vi+ and minus main input Vi− of the delay cell (410), so they form the 4 stage main ring loop. The 2 stage subsidiary ring loop comprises total 8 loops (411, 412, 421, 422, 431, 432, 441, 442).

The loops (421, 422, 431, 432, 441, 442) are same as the subsidiary 2 stage loop shown in FIG. 3A. Namely, the plus output Vo+ and the minus output Vo− of the next stage are each connected to the plus subsidiary input Via+ and the minus subsidiary input Via− of the previous stage, so they form a subsidiary 2 stage loop and negative feedback loop in DC. However, the loop (412) and the loop (411) are contrary to other subsidiary ring loops.

Namely, in the subsidiary 2 stage ring oscillator composed of the delay cell (440) and the delay cell (410), two outputs Vo+ and Vo− of the delay cell (410) are each connected to two subsidiary inputs Via− and Via+, so they form the subsidiary ring, because outputs Vo+ and Vo− of the delay cell (440) are each connected to main inputs Vi+ and Vi− of the delay cell (410) in order that 4 stage main ring loop is negative feedback loop in DC. As it were, because the connect between the output of the delay cell (440) and the main input of the delay cell (410) has no phase inverse, in the subsidiary 2 stage ring oscillator composed of two delay cells, the loop (412) and the loop (411) is constructed contrary to conventional 2 stage ring oscillator in order that the subsidiary 2 stage ring loop has a negative feedback in DC. As shown in FIG. 4 in this invention, we add the subsidiary 2 stage ring loop to the 4 stage ring oscillator, so effective delay time of each cell is decreased, therefore it operates in high speed than conventional 4 stage ring oscillator. In addition, in 4 stage ring oscillator, we can add only 3 stage subsidiary ring loop or add 2 stage and 3 stage subsidiary ring loops at the same time, so the multiple feedback loop ring oscillator can be constructed.

Figure 5:
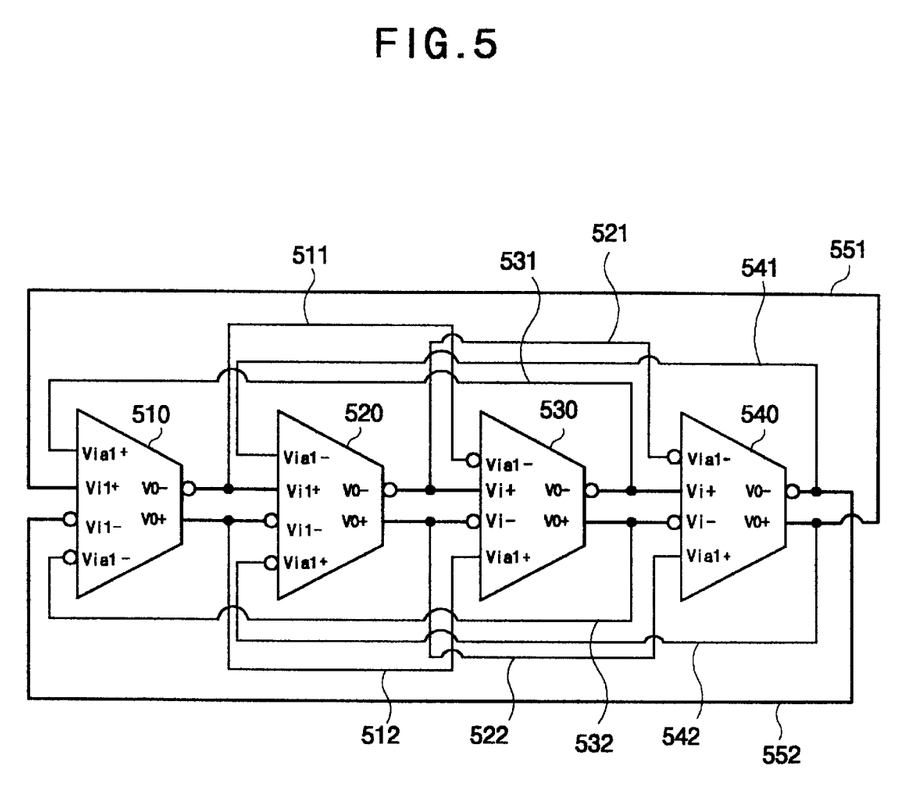
FIG. 5 is a circuit diagram of a 4 stages—3 substages multiple feedback loop ring oscillator according to the present invention.

FIG. 5 is a circuit diagram of a 4 stages—3 substages multiple feedback loop ring oscillator according to the present invention.

Referring to FIG. 5, we explain 4 stages—3 substages multiple feedback loop ring oscillator adding 3 stages of J subsidiary ring loop to 4 stage ring oscillator according to the present invention. It comprises 4 differential delay cells (510, 520, 530, 540), which have two differential input stage and one differential output stage as shown in FIG. 3A and FIG. 4. 4 stage main ring loop comprises two loops (551, 552), in order to construct negative feedback loop in DC, the plus output Vo+ and the minus output Vo− of the delay cell (540) are each connected to the plus main input Vi+ and the minus main input Vi− of the delay cell (510), so 4 stage main ring loop is organized. 3 stage subsidiary ring loop comprises total 8 loops (511, 512, 521, 522, 531, 532, 541, 542). Four 3-stage subsidiary ring loops (531, 532, 541, 542) can be formed same as the construction of the conventional 3 stage ring oscillator.

For example, as shown in FIG. 5, in the 3 stage ring constructed with delay cell (510)–delay cell (520)–delay cell (530), loops (531, 532) which connect Vo+ and Vo− of the delay cell (530) to subsidiary inputs Via− and Via+ of the a delay cell (510) organize 3 stage subsidiary ring loop, and the loop is a negative feedback loop in DC. Four subsidiary loops (511, 512, 521, 522, 531, 532, 541, 542) form contrary to the structure of the conventional 3 stage ring oscillator with a same reason as subsidiary loops (411, 412) shown in FIG. 4.

For example, in the 3 stage ring constructed with delay cell (530)–delay cell (540)–delay cell (510), because outputs Vo+ and Vo− of the delay cell (540) are each connected to Vi+ and Vi− of the delay cell (510) in order to construct a 4 stage main ring loop, in a 3 stage subsidiary ring loop, in order that this phase relation of the delay cell (540) and the delay cell (510) is compensated and the negative feedback is formed in DC, the plus output Vo+ of the delay cell (510) is connected to the plus subsidiary input Via+ of the delay cell (530), the minus output Vo− of the delay cell (530) is connected to the minus subsidiary input Via− of the delay cell (530), so loops (511, 512) is comprised.

Loops (521, 522) are formed with same principle. With the 4 stages—3 substages multiple feedback loop ring oscillator which add 3 stage subsidiary ring loop to 4 stage ring oscillator as shown in FIG. 5, we can obtain higher oscillation frequency than conventional 4 stage ring oscillator because effective delay time of each delay cell is reduced.

Figure 6:
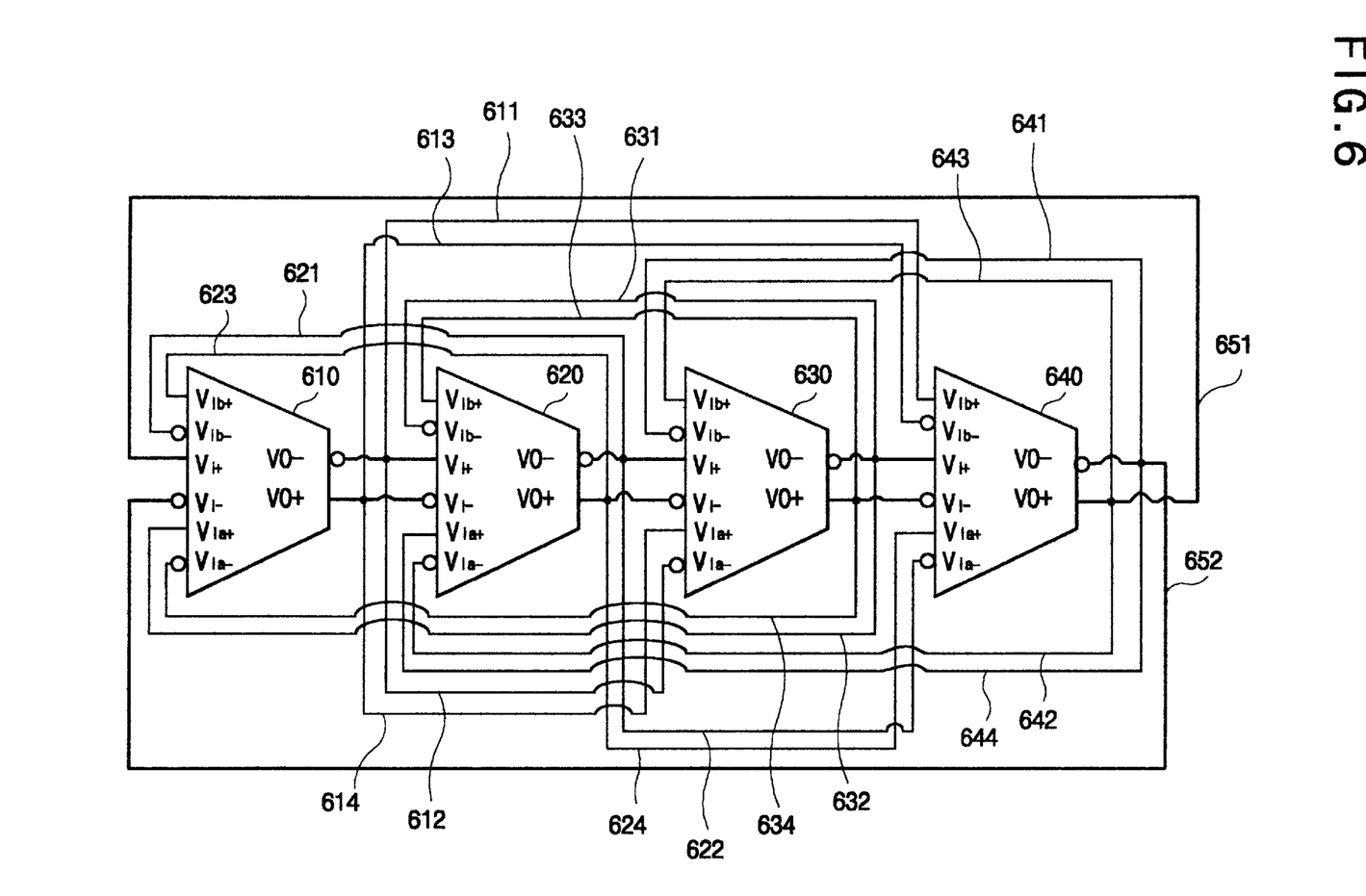
FIG. 6 is a circuit diagram of a multiple feedback loop ring oscillator which combines 4 stages—2 substages and 3 substages according to the present invention.

FIG. 6 is a circuit diagram of a 4 stages—2 substages and 3 substages multiple feedback loop ring oscillator according to the present invention. Referring to FIG. 6, we explain 4 stages—2 substages and 3 substages multiple feedback loop ring oscillator adding 2 stages and 3 stages of subsidiary ring loop to 4 stage ring oscillator according to the present invention. It comprises 4 differential delay cells (610, 620, 630, 640), which have main input stages Vi+ and Vi– constructing main ring loop, 3 stage subsidiary input stages Via+ and Via– constructing 3 stage subsidiary input loop, 2 stage subsidiary input stages Vib+ and Vib– constructing 2 stage subsidiary loop and output stages Vo+ and Vo–.

4 stage main ring loop is composed of loops (651, 652), in order to construct the negative feedback loop in DC, the plus output Vo+ and the minus output Vo– of the delay cell (640) are each connected to the plus main input Vi+ and the minus main input Vi– of the delay cell (610), so 4 stage main ring loop is organized. 2 stage subsidiary ring loop comprises total 8 loops (611, 613, 621, 623, 631, 633, 641, 643), 6 loops (621, 623, 631, 633, 641, 643) can be formed same as the construction of the conventional 2 stage ring oscillator.

For example, as shown in FIG. 6, in the 2 stage ring constructed with delay cell (610)–delay cell (620), loops (621, 623) which connect Vo+ and Vo– of the delay cell (620) to subsidiary inputs Vib+ and Vib– of the delay cell (610) organize 2 stage subsidiary ring loop, and the loop is a negative feedback loop in DC. the loop (613) and the loop (611), subsidiary loops form contrary to the structure of the conventional 2 stage ring oscillator with the same reason as the subsidiary loop (80) and the loop (81) shown in FIG. 4. Namely, because outputs Vo+ and Vo– of the delay cell (640) are each connected to the Vi+ and Vi– of the delay cell (610) in order to construct a 4 stage main ring loop, in the subsidiary 2 stage ring oscillator constructed with delay cell (640) delay cell (610), in order that this phase relation of the delay cell (540) and the delay cell (510) is compensated and the negative feedback is formed in DC, the plus output Vo+ of the delay cell (610) is connected to the minus subsidiary input Vib– of the delay cell (640), the minus output Vo– of the delay Cell (610) is connected to the plus subsidiary input Vib+ of the delay cell (640), so the loop (613) and the loop (611), subsidiary 2 stage ring loops are comprised. 3 stage subsidiary ring loops comprise total 8 loops (612, 614, 622, 624, 632, 634, 642, 644). Four 3-stage subsidiary ring loop (632, 634, 642, 644) are formed same as the construction of the conventional 3 stage ring oscillator such as loops (531, 532, 541, 544) shown in FIG. 5. For example, in the subsidiary 3 stage ring oscillator constructed with delay cell (610)–delay cell (620) -delay cell (630), loops (632, 634) which connect Vo+ and Vo– of the delay cell (630) to subsidiary inputs Via– and Via+ of the delay cell (610) organize 3 stage subsidiary ring loop, and the loop is a negative feedback loop in DC. Four subsidiary loops (612, 614, 622, 624) form contrary to the structure of the conventional 3 stage ring oscillator with a same reason as loops (511, 512) shown in FIG. 4.

For example, in the subsidiary 3 stage ring oscillator constructed with delay cell (630)–delay cell (640)–delay cell (610), because outputs Vo+ and Vo– of the delay cell (640) are each connected to Vi+ and Vi– of the delay cell (610) in order to construct a 4 stage main ring loop, in the subsidiary 3 stage ring oscillator constructed with delay cell (630) –delay cell (640)–delay cell (610), in order that phase relation of the main loop between the delay cell (640) and the delay cell (610) is compensated and the negative feedback is formed in DC, the plus output Vo+ of the delay cell (610) is connected to the plus subsidiary input Via+ of the delay cell (630), the minus output Vo– of the delay cell (610) is connected to the minus subsidiary input Via– of the delay cell (630), so loops (612, 614) is comprised. Loops (622, 624) are formed with same principle.

With the 4 stages—2 substages and 3 substages multiple feedback loop ring oscillator which add 2 stages and 3 stages subsidiary ring loop to 4 stages ring oscillator, we can obtain higher oscillation frequency.

Until now, we explain 4 new multiple feedback loop ring oscillators.

Now, delay cells of the ring oscillators will be described.

Figure 7:
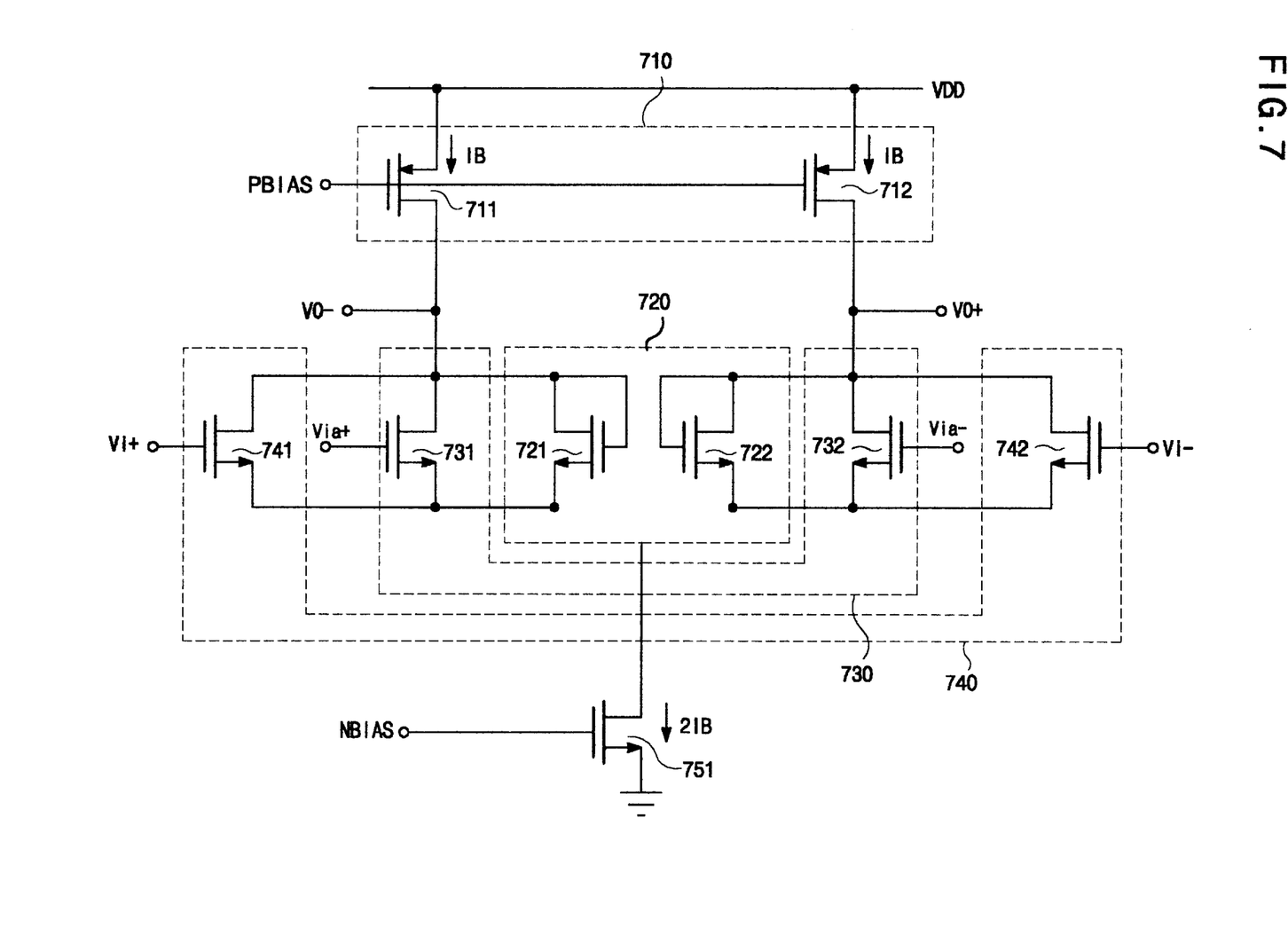
FIG. 7 is a circuit diagram of a delay cell for a multiple feedback loop ring oscillator according to the present invention.

FIG. 7 is a circuit diagram of a delay cell for a multiple feedback loop ring oscillator according to the present invention. Referring to FIG. 7, one of delay cells used in multiple feedback loop ring oscillators proposed in the present invention is described. This delay cell is also used in ring oscillators shown in FIG. 3A, FIG. 4 and FIG. 5. This delay cell comprises main differential input stage (740), current source load stage (710), current source stage (751), voltage clamping stage (720) and subsidiary differential input stage (730).

With subsidiary differential input stage (730), 2 stage subsidiary ring loop is formed in multiple feedback loop ring oscillators shown in FIG. 3A and FIG. 4, and 3 stage subsidiary ring loop is formed in the multiple feedback loop ring oscillator shown in FIG. 5. The differential amplifier composed of 710, 740 and 751 elements is same as the conventional circuit, so we can adjust oscillation frequency of the ring oscillator because bias current value of the delay cell is adjusted by the control voltage PBIAS and NBIAS. Bias voltage PBIAS and NBIAS is decided according to bias circuits in order that currents which flow in each PMOS transistor of the current source load stage (710) is IB, and currents which flow in each NMOS transistor of the current source stage (751) is 2IB.

The voltage clamping stage (720) restricting the output swing comprises transistors (721, 722), its gate and drain are connected, so it operates as a diode. In case of the conventional method using transistors connected as a diode in order to restrict the output swing, transistors forming a diode are directly connected to the power or ground line. In that case, outputs swing on the base of power or ground line, so it is difficult to interface in a high frequency, and the diode having low impedance is connected to a power line, so the power sensitivity which shows change amounts of the oscillation frequency for the change of a power line becomes worse.

However, in the voltage clamping stage (720) proposed in this invention, because transistors forming a diode (721, 722) restrict the output swing but aren't directly connected to any power lines, so outputs swing between values of a power and the interface with other circuits are easy in a high frequency.

The current change of a power line leads the voltage down on the parasitic resistance and inductance existing on a power line and a package lead, so it appears to the change of a power voltage.

We can think this change of a power voltage as a noise of ring oscillator, so jitter or phase noise characteristics of an oscillator become worse because of it. However, because the AD voltage clamping circuit (720) is formed as in FIG. 7 in delay cells of the invention, the power current (2IB) scarcely changes in the middle of the circuit's operation, so a power voltage becomes stable and power noise characteristics of a circuit become better. At the same time, the output impedance decreases by transistors forming a diode, so the pole frequency of delay stages increases and high speed operations are possible. And, the power sensitivity decrease because output nodes are connected to the power and ground line through the current source with a large impedance of the load current stage (710) and the current source stage (751).

Figure 8:
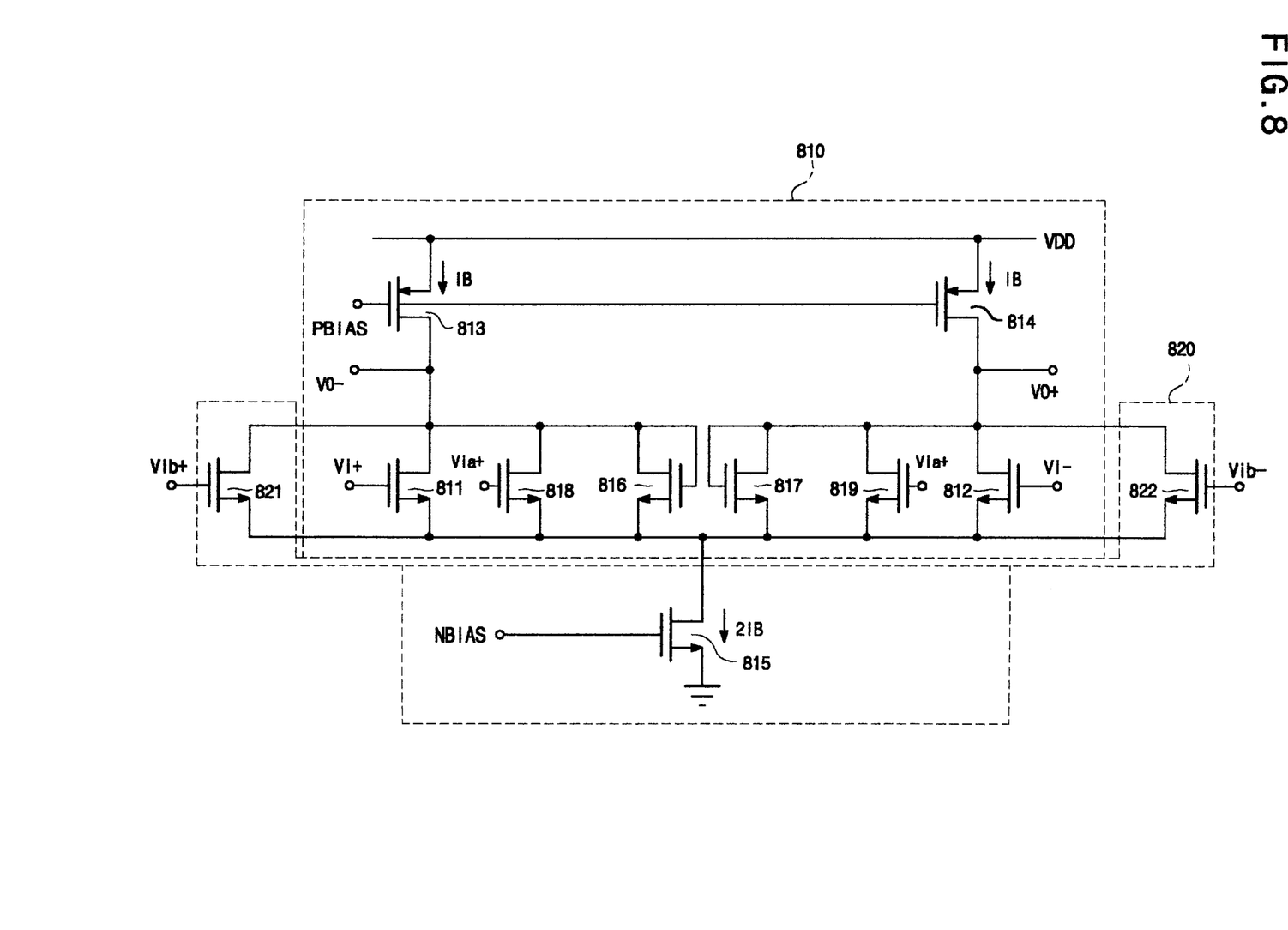
FIG. 8 is a circuit diagram of a delay cell for a multiple feedback loop ring oscillator according to the present invention.

FIG. 8 is a circuit diagram of a delay cell for a multiple feedback loop ring oscillator according to the present invention. Referring to the FIG. 8, the delay cell circuit used in the multiple feedback loop ring oscillator shown in FIG. 6 will be described. This delay cell is formed by adding another subsidiary differential delay cell (820) to the delay cell (810) shown in FIG. 7 in order to construct 2 stage and 3 stage subsidiary ring loop. Because bias is formed by the same method shown in FIG. 7 and has same operation characteristic as the delay cell shown in FIG. 7, the interface with other circuits is easy, because output nodes separate from each power line, the power sensitivity is low, and because power currents are sustained regularly, power noise characteristics become better.

As described above in detail, with new structures of multiple feedback loop ring oscillators, a high speed PLL can be realized using CMOS processes which have low operation speed. Because CMOS processes are cheaper than other processes and have high density, with the multiple feedback loop ring oscillator proposed in the present invention, the integration of a high speed PLL and other systems is possible, so we can make cheap systems with a high performance.

The larger power consumptions, the higher the oscillation frequency of the ring oscillator. So if we use the multiple feedback loop ring oscillator to a low speed PLL, we can obtain same oscillation frequency with small power consumption, so an energy is saved.

Because delay cells proposed in the invention operate in a high speed, have low power sensitivity and have good power noise characteristics, if used as the delay cell of the ring oscillator in a phase fixing loop, total performance of a PLL is improved.

What is claimed is:

1. A multiple feedback loop ring oscillator, comprising:

first, second, and third delay cells each having a first main input stage, a second main input stage, a first subsidiary input stage, a second subsidiary input stage, a first output stage, and a second output stage;

a main loop wherein said first and second output stages of said first delay cell are respectively connected to said second and first main input stages of said second delay cell, said first and second output stages of said second delay cell are respectively connected to said second and first main input stages of said third delay cell, and said first and second output stages of said third delay cell are respectively connected to said second and first main input stages of said first delay cell; and a subsidiary loop wherein said first and second subsidiary input stages of said first delay cell are respectively connected to said first and second output stages of said second delay cell, said first and second subsidiary input stages of said second delay cell are respectively connected to said first and second output stages of said third delay cell, and said first and second subsidiary input stages of said third delay cell are respectively connected to said first and second output stages of said first delay cell.

2. A multiple feedback loop ring oscillator, comprising:

first, second, third, and fourth delay cells each having a first main input stage, a second main input stage, a first subsidiary input stage, a second subsidiary input stage, a first output stage, and a second output stage;

a main loop wherein said first and second output stages of said first delay cell are respectively connected to said second and first main input stages of said second delay cell, said first and second output stages of said second delay cell are respectively connected to said second and first main input stages of said third delay cell, said first and second output stages of said third delay cell are respectively connected to said second and first main input stage of said fourth delay cell, and said first and second output stages of said fourth delay cell are respectively connected to said second and first main input stage of said first delay cell; and a subsidiary loop wherein said first and second subsidiary input stages of said first delay cell are respectively connected to said first and second output stages of said second delay cell, said first and second subsidiary input stages of said second delay cell are respectively connected to said first and second output stages of said third delay cell, said first and second subsidiary input stages of said third delay cell are respectively connected to said first and second output stages of said fourth delay cell, and said first and second subsidiary input stages of said fourth delay cell are respectively connected to said first and second output stages of said first delay cell.

3. A multiple feedback loop ring oscillator, comprising:

first, second, third, and fourth delay cells each having a first main input stage, a second main input stage, a first subsidiary input stage, a second subsidiary input stage, a first output stage, and a second output stage;

a main loop wherein said first and second output stages of said first delay cell are respectively connected to said second and first main input stages of said second delay cell, said first and second output stages of said second delay cell are respectively connected to said second and first main input stages of said third delay cell, said first and second output stages of said third delay cell are respectively connected to said second and first main input stage of said fourth delay cell, and said first and second output stages of said fourth delay cell are respectively connected to said second and first main input stage of said first delay cell; and a subsidiary loop wherein said first and second subsidiary input stages of said first delay cell are respectively connected to said first and second output stages of said third delay cell, said first and second subsidiary input stages of said second delay cell are respectively connected to said first and second output stages of said fourth delay cell, said first and second subsidiary input stages of said third delay cell are respectively connected to said first and second output stages of said first delay cell, and said first and second subsidiary input stages of said fourth delay cell are respectively connected to said first and second output stages of said second delay cell.

4. A multiple feedback loop ring oscillator, comprising:

first, second, third, and fourth delay cells each having a first main input stage, a second main input stage, a first subsidiary input stage, a second subsidiary input stage, a third subsidiary input stage, a fourth subsidiary input stage, a first output stage, and a second output stage;

a main loop wherein said first and second output stages of said first delay cell are respectively connected to said second and first main input stages of said second delay cell, said first and second output stages of said second delay cell are respectively connected to said second and first main input stages of said third delay cell, said first and second output stages of said third delay cell are respectively connected to said second and first main input stage of said fourth delay cell, and said first and second output stages of said fourth delay cell are respectively connected to said second and first main input stage of said first delay cell;

a first subsidiary loop wherein said first and second subsidiary input stages of said first delay cell are respectively connected to said first and second output stages of said third delay cell, said first and second subsidiary input stages of said second delay cell are respectively connected to said first and second output stages of said fourth delay cell, said first and second subsidiary input stages of said third delay cell are respectively connected to said first and second output stages of said first delay cell, and said first and second subsidiary input stages of said fourth delay cell are respectively connected to said first and second output stages of said second delay cell; and a second subsidiary loop wherein said third and fourth subsidiary input stages of said first delay cell are respectively connected to said first and second output stages of said second delay cell, said third and fourth subsidiary input stages of said second delay cell are respectively connected to said first and second output stages of said third delay cell, said third and fourth subsidiary input stages of said third delay cell are respectively connected to said first and second output stages of said fourth delay cell, and said third and fourth subsidiary input stages of said fourth delay cell are respectively connected to said first and second output stages of said first delay cell.

* * * * *